(12) United States Patent
Arima et al.

(10) Patent No.: US 6,226,753 B1
(45) Date of Patent: *May 1, 2001

(54) SINGLE CHIP INTEGRATED CIRCUIT WITH EXTERNAL BUS INTERFACE

(75) Inventors: Yuki Arima; Mitsugu Satou, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/835,476

(22) Filed: Apr. 8, 1997

(30) Foreign Application Priority Data

Oct. 30, 1996 (JP) .................................................. 8-288261

(51) Int. Cl.[7] ................................. G06F 1/26; G06F 1/28; G06F 1/30
(52) U.S. Cl. ......................... 713/300; 713/322; 713/323; 713/340; 713/400; 714/37; 714/38; 714/42; 714/726; 714/733; 714/736; 714/738; 714/739; 714/742; 714/745; 365/203; 365/226; 712/1; 712/39; 712/40
(58) Field of Search ...................................... 365/203, 226; 371/28; 395/183.13, 183.14, 183.18, 750.01, 800, 550; 364/900, 200; 714/726, 733, 736, 738, 739, 742, 745, 37, 38, 42; 713/400, 300, 322, 323, 340; 712/1, 39, 40

(56) References Cited

U.S. PATENT DOCUMENTS

| | | | | |
|---|---|---|---|---|
| 4,460,972 | * | 7/1984 | Homan et al. | 712/229 |
| 4,628,448 | * | 12/1986 | Murao | 712/39 |
| 5,430,736 | * | 7/1995 | Takeoka et al. | 714/726 |
| 5,493,686 | * | 2/1996 | Keida et al. | 712/40 |
| 5,517,659 | * | 5/1996 | Bourekas et al. | 712/39 |
| 5,657,330 | * | 8/1997 | Matsumoto | 714/733 |
| 5,673,231 | * | 9/1997 | Futurani | 365/203 |
| 5,675,808 | * | 10/1997 | Gulick et al. | 713/322 |
| 5,687,180 | * | 11/1997 | Kawasaki | 714/745 |
| 5,694,611 | * | 12/1997 | Matsubara | 712/39 |
| 5,724,297 | * | 3/1998 | Noda et al. | 365/226 |
| 5,790,565 | * | 8/1998 | Sakaguchi | 714/738 |

\* cited by examiner

Primary Examiner—Ayaz Sheikh
Assistant Examiner—Frantz Blanchard Jean
(74) Attorney, Agent, or Firm—Burns, Doane, Swecker & Mathis, LLP (57) ABSTRACT

A semiconductor integrated circuit for suppressing power consumption is provided. In the case where an internal signal should be monitored from outside the circuit, an output control circuit outputs the same value as that of the internal signal from each of external terminals. In the case where the internal signal does not need to be monitored, e.g., in the same manner as ordinary user's use, the output control circuit outputs an invariable value from each of the external terminals. Thus, in the case where the internal signal does not need to be monitored, the invariable value is outputted. Consequently, power consumption can be suppressed.

5 Claims, 9 Drawing Sheets

SINGLE CHIP INTEGRATED CIRCUIT WITH EXTERNAL BUS INTERFACE

BACKGROUND OF THE INVENTION

1. Field of the Invention

The present invention relates to a semiconductor integrated circuit (data processor) having a memory and a microprocessor built therein, and more particularly to a semiconductor integrated circuit which suppresses power consumption.

2. Description of the Background Art

Recently, semiconductor integrated circuits have rapidly become finer. At present, a memory and a microprocessor can be built in one chip. In the past when a memory and a microprocessor could not be built in one chip, the memory chip and the microprocessor chip were interconnected by wiring. In the two chip system, it was sufficient that a signal sent to the wiring was observed in order to observe a signal sent between the memory and the microprocessor. In addition, the signal sent between the memory and the microprocessor could always be observed. However, since the memory and the microprocessor are now built on a single chip, there is a problem that the signal sent between the memory and the microprocessor (hereinafter referred to as an "internal signal") can only be observed with difficulty.

Figure 9:
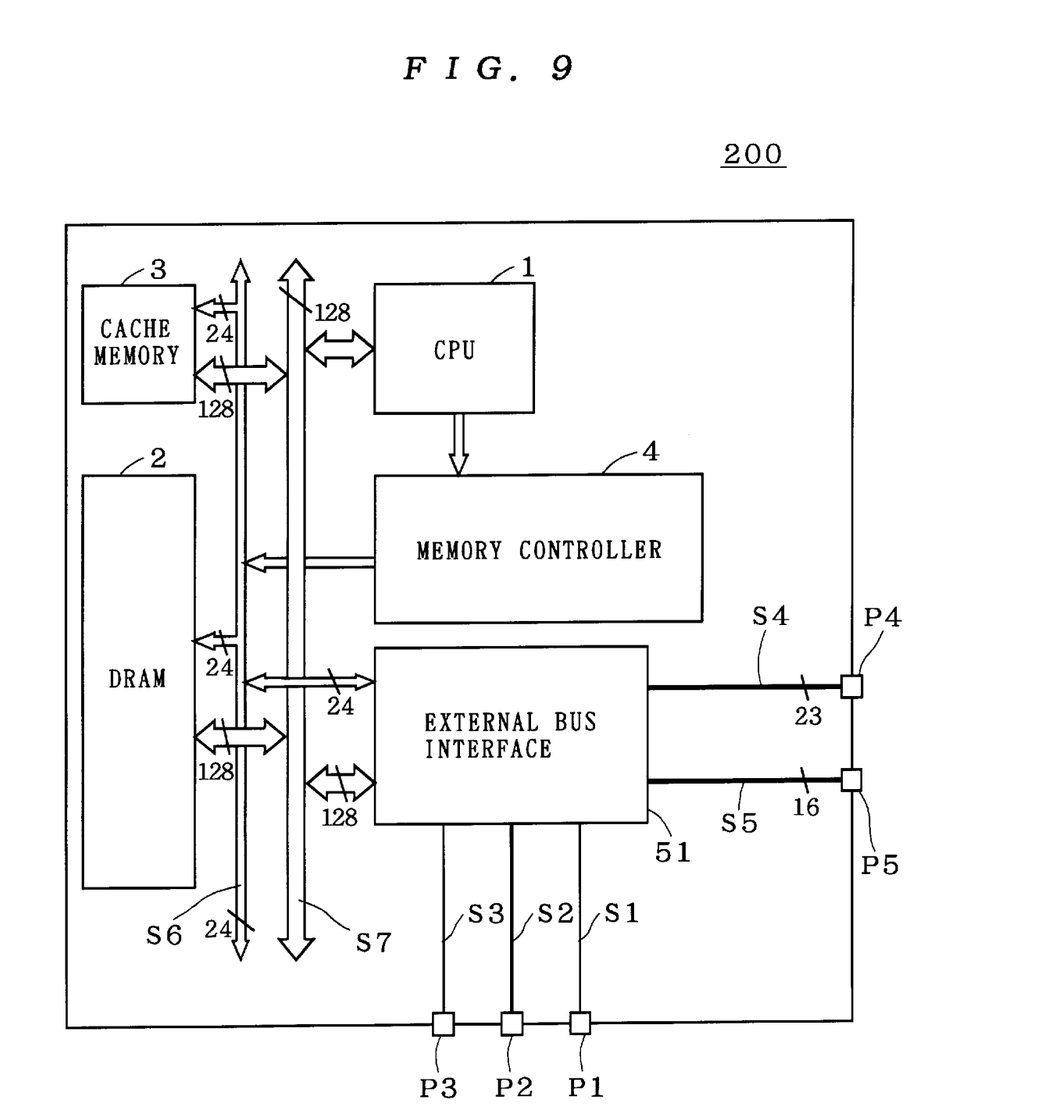
FIG. 9 is a block diagram showing a semiconductor integrated circuit according to the prior art.

In order to more easily observe the internal signal, a semiconductor integrated circuit shown in FIG. 9 has been developed. FIG. 9 is a block diagram showing an example of a semiconductor integrated circuit 200 having a memory and a microprocessor built in one chip according to the prior art.

The internal signal includes address information, data inputted to or outputted from the memory, and a DRAM access control signal. The DRAM access control signal includes a bus status signal, a byte control signal, and a read/write signal.

P1 denotes an external terminal for outputting the bus status signal. P2 denotes an external terminal for inputting and outputting the byte control signal. P3 denotes an external terminal for inputting and outputting the read/write signal. P4 denotes an external terminal for inputting and outputting the address information. P5 denotes an external terminal for inputting and outputting data. S6 denotes a signal line (an address bus) for mutually connecting a microprocessor 1 through a DRAM 2, a cache memory 3 and a memory controller 4 to send the address information. S7 denotes a signal line (data bus) for connecting the microprocessor 1, the DRAM 2 and the cache memory 3 to send the data.

An external bus interface 51 controls the outputs of the address information, the data and the DRAM access control signal described above. S1 to S5 denote signal lines for connecting the external bus interface 51 to the external terminals P1 to P5, respectively.

The features of the operation of the semiconductor integrated circuit 200 are as follows. The internal signal is always outputted to the external terminals P1 to P5. Accordingly, the internal signal can be easily observed by observing the signals in the external terminals P1 to P5. In other words, a signal sent between the memory and the microprocessor can always be observed in the same manner as in a chip in which the memory and the microprocessor were not provided on a common chip.

Figure 10:
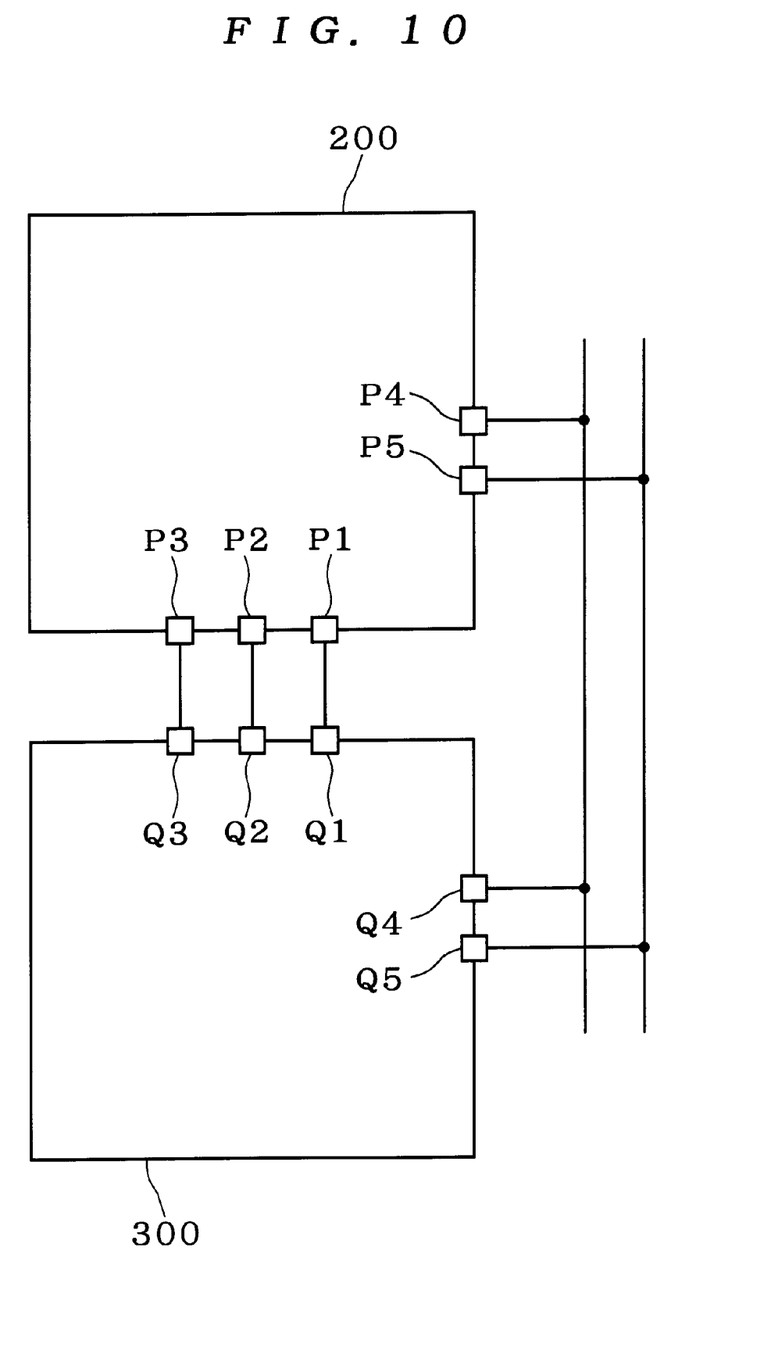
FIG. 10 is a diagram showing a structure of connection of the semiconductor integrated circuit and an external memory.

The microprocessor 1 of the semiconductor integrated circuit 200 can also gain access to external memories. A signal exchange necessary for this access is performed by using the external terminals P1 to P5. FIG. 10 is a general diagram in which the semiconductor integrated circuit 200 is connected to a DRAM 300 that is an external memory. The external terminals P1 to P5 are connected to external terminals Q1 to Q5 of the DRAM 300, respectively (whose functions correspond to those of the external terminals P1 to P5, respectively).

Although it is necessary to output an internal signal from each of the external terminals P1 to P5 in order to monitor the internal operation when testing the semiconductor integrated circuit 200, it is not necessary to output the internal signal when an ordinary user makes use of the semiconductor integrated circuit 200. According to the prior art, however, the internal signal is outputted from each of the external terminals P1 to P5 even when it is unnecessary. In general, power is consumed when the value of the outputted signal is changed. With the semiconductor integrated circuit 200, accordingly, the internal signal is outputted in spite of this being an unnecessary operation. Consequently, unnecessary power consumption is the result of this output.

SUMMARY OF THE INVENTION

In order to solve the above-mentioned problems of the prior art, it is an object of the present invention to provide a semiconductor integrated circuit for controlling outputs to suppress power consumption.

A first aspect of the present invention is directed to a semiconductor integrated circuit, comprising a data processing section for processing data, a memory for storing the data, external terminals, and an output control section for giving, to the external terminals respectively, an internal signal used for the processing in a first state and a stationary value in a second state which is different from the first state.

A second aspect of the present invention is directed to the semiconductor integrated circuit, wherein the output control section receives the internal signal and an output control signal which indicates either the first state should be output or the second state, and internal operation of the semiconductor integrated circuit is monitored in the first state and the internal operation of the semiconductor integrated circuit does not need to be monitored in the second state.

A third aspect of the present invention is directed to the semiconductor integrated circuit, further comprising an external input terminal for inputting a output control signal from a circuit other than the semiconductor integrated circuit.

A fourth aspect of the present invention is directed to the semiconductor integrated circuit, further comprising an output control signal storing section for outputting a stored value as the output control signal, wherein a program to be executed by the data processing section to write the value to the output control signal storing section is stored in the memory.

A fifth aspect of the present invention is directed to the semiconductor integrated circuit, further comprising an input terminal for inputting, from a circuit other than the present semiconductor integrated circuit, an enabling signal to enable writing of a value to the output control signal storing section, wherein the data processing section can write a value to the output control signal storing section only in the case where the enabling signal is given from the external input terminal.

A sixth aspect of the present invention is directed to the semiconductor integrated circuit further comprising an output control signal generating section which includes a fuse and outputs which supplies to the output control section, the output control signal indicative of the second or first state corresponding to whether the fuse is disconnected or not.

According to the first aspect of the present invention, the case where the internal signal is given to the external terminals is restricted to only the first state. Consequently, it is possible to obtain an effect that power consumption can be suppressed.

According to the second aspect of the present invention, the output control signal is used, which indicates the second state where the internal signal is processed only on its inside or not at all. Consequently, the output control section can be implemented by a simple circuit for inputting the output control signal and the internal signal.

According to the third aspect of the present invention, the external input terminal for inputting the output control signal from outside the circuit is provided. Consequently, it is possible to control that the internal signal of the semiconductor integrated circuit is monitored on the outside or not.

According to the fourth aspect of the present invention, the outputs of the external terminals are controlled by the program. Consequently, it is possible to obtain an effect that power consumption can be suppressed.

According to the fifth aspect of the present invention, it is possible to obtain an effect that the outputs of the external terminals are controlled from the outside to eliminate unnecessary power consumption even if a false program to output the internal signal from each of the external terminals is stored in the memory.

According to the sixth aspect of the present invention, the output control signal generating section including the fuse is provided. Consequently, in the case where it is decided by monitoring the internal signal that the semiconductor integrated circuit is an article of good quality, it is possible to obtain an effect that unnecessary power can be prevented from being consumed due to the erroneous output of the internal signal from each of the external terminals if the fuse is disconnected.

In order to solve the above-mentioned problems, it is an object of the present invention to provide a semiconductor integrated circuit for controlling outputs to suppress power consumption.

These and other objects, features, aspects and advantages of the present invention will become more apparent from the following detailed description of the present invention when taken in conjunction with the accompanying drawings.

DESCRIPTION OF THE PREFERRED EMBODIMENTS

Principle of the Invention

Figure 1:
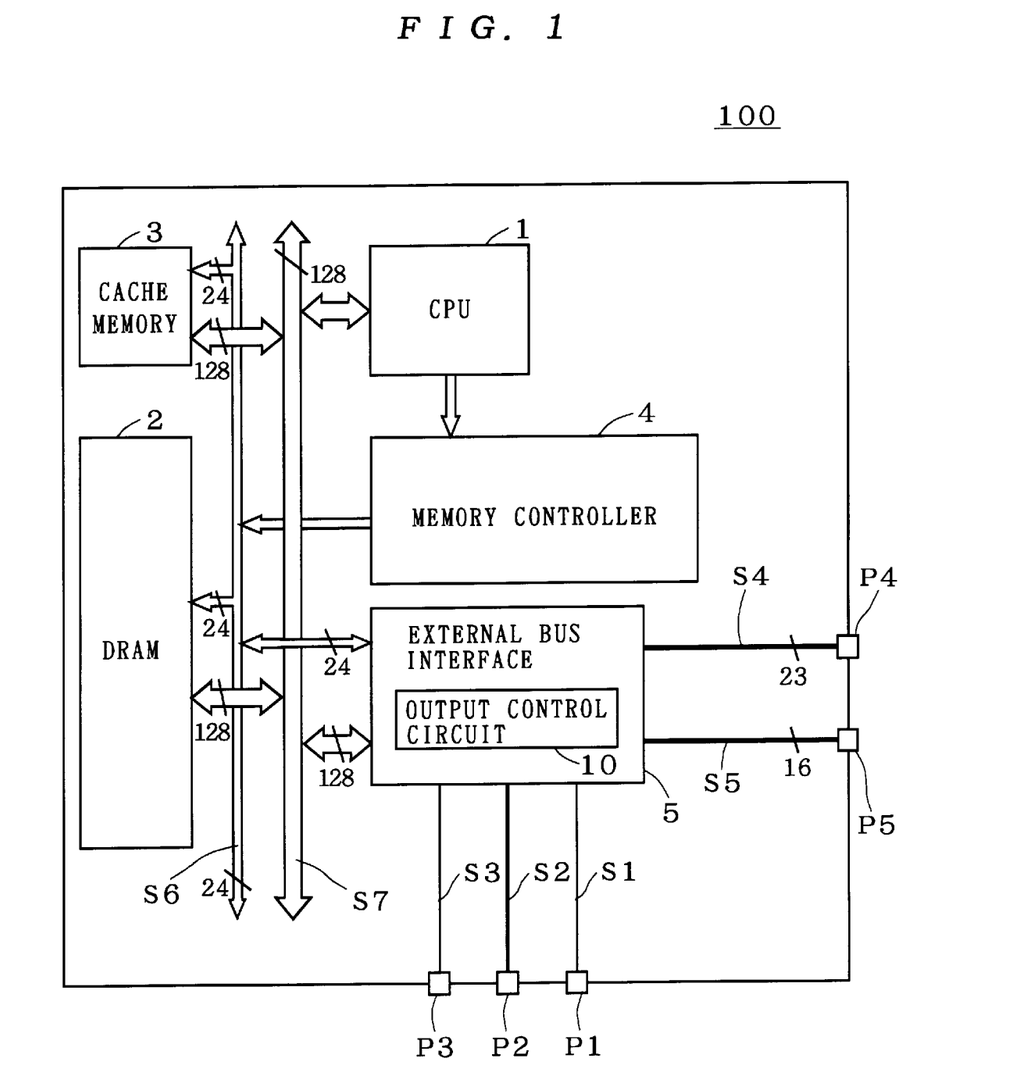
FIG. 1 is a block diagram showing a semiconductor integrated circuit according to the present invention.

FIG. 1 is a block diagram showing a semiconductor integrated circuit 100 according to the present invention in which a memory and a microprocessor are built in one chip. In FIG. 1, the reference numeral 1 denotes a RISC type microprocessor (CPU) which acts as a data processing section for processing data, the reference numeral 2 denotes a DRAM, the reference numeral 3 denotes a cache memory formed by a SRAM, the reference numeral 4 denotes a memory controller for controlling a memory, and the reference numeral 5 denotes an external bus interface for controlling an input/output of signals.

An internal signal includes address information for access to a memory, data written to or read from the memory, and a DRAM access control signal for causing the microprocessor 1 to control the DRAM 2. The DRAM access control signal includes a bus status signal for deciding whether a bus cycle is instruction fetch access or operand access, a byte control signal for designating a specific one of a plurality of bytes indicated by the address information when writing the data to the memory, and a read/write signal for identifying writing or reading operation of the data.

P1 denotes an external terminal for outputting the bus status signal. P2 denotes an external terminal for inputting and outputting the byte control signal. P3 denotes an external terminal for inputting and outputting the read/write signal. P4 denotes an external terminal for inputting and outputting the address information. P5 denotes an external terminal for inputting and outputting the data. S6 denotes a signal line (an address bus) for mutually connecting the microprocessor 1 through the DRAM 2, the cache memory 3 and the memory controller 4 to send the address information. S7 denotes a signal line (data bus) for connecting the microprocessor 1, the DRAM 2 and the cache memory 3 to send the data.

The external bus interface 5 controls the outputs of the address information, the data and the DRAM access control signal described above. S1 to S5 denote signal lines for connecting the external bus interface 5 to the external terminals P1 to P5, respectively.

The numbers of bit lines included in the signal lines S1 to S7 are 1, 2, 1, 23, 16, 24 and 128, respectively. The external terminals P1 to P5 are provided for each bit line. More specifically, the number of external terminals included in the external terminals P1 to P5 are 1, 2, 1, 23 and 16, respectively.

The semiconductor integrated circuit 100 can also gain access to a memory provided on an outside thereof. In this case, connection is performed in the same manner as in the case where the semiconductor integrated circuit 200 shown in FIG. 10 is replaced with the semiconductor integrated circuit 100.

Furthermore, access can also be gained from outside the current to the DRAM 2. For example, in the case where data such as programs are written from outside the circuit to the DRAM 2, the byte control signal is inputted from outside the circuit to the external terminal P2, the read/write signal is inputted from outside the circuit to the external terminal P3, the address information is inputted from outside the circuit to the external terminal P4 and the data is inputted from outside the circuit to the external terminal P5. Thus, the external terminals P2 to P5 also serve as input terminals.

In FIG. 1. the reference numeral 10 denotes an output control circuit (output control section). The output control circuit 10 is built in the external bus interface 5 for outputting an invariable value (a stationary value) from each of the external terminals P1 to P5 while the internal signal is processed only internally and for outputting the value of the internal signal from each of the external terminals P1 to P5 as it is when testing the semiconductor integrated circuit 100. In the case where the semiconductor integrated circuit 100 gains access to an external memory, the output control circuit 10 is not concerned with control related to output to the external terminals P1 to P5.

Figure 2:
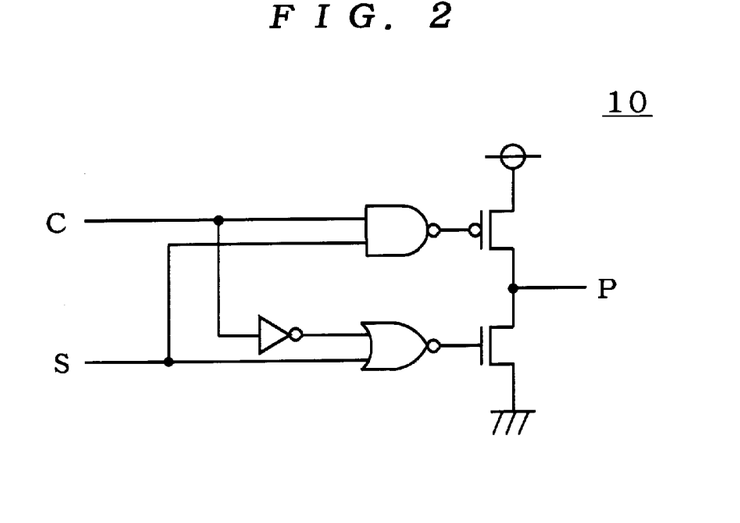
FIG. 2 is a circuit diagram showing an example of an output control circuit.
Figure 3:
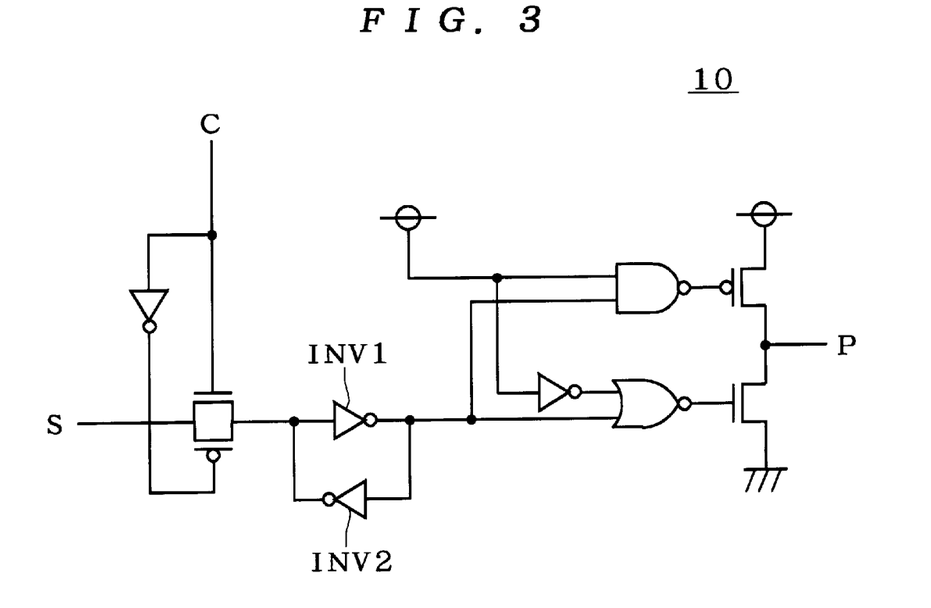
FIG. 3 is a circuit diagram showing another example of the output control circuit.

Two examples of the output control circuit 10 are shown in FIGS. 2 and 3, respectively. The circuits shown in FIGS. 2 and 3 are provided for each bit line of the signal lines S1 to S5. In FIGS. 2 and 3, a terminal P is connected to the bit line, a terminal S receives an internal signal, and a terminal C receives an output control signal which indicates whether the internal signal is processed only on the inside or not.

The operation of the circuit shown in FIG. 2 will be described below. If the output control signal has the "H" level, the same value as that of the internal signal received by the terminal S is outputted to the terminal P. If the output control signal has the "L" level, the terminal P has a high impedance. In other words, the value given to the external terminal is a fixed stationary value.

The operation of the circuit shown in FIG. 3 will be described below. If the output control signal has the "H" level, the internal signal received by the terminal S is outputted to the terminal P as it is. If the output control signal has the "L" level, a value obtained immediately before the output control signal is changed to a signal having the "L" level (hereinafter referred to as a "previous value") is outputted to the external terminal. In other words, the value given to the external terminal is a fixed stationary value. Inverters INV1 and INV2 store the previous value. The driving capability of the inverter INV2 is smaller than that of the inverter INV1.

It is supposed that a logic circuit (not shown) for receiving the output of the terminal P is connected in FIGS. 2 and 3. When the output of the terminal P is changed, a through current flows from a power supply to a ground in the logic circuit so that power is consumed. However, if the output of the terminal P has a high impedance or a previous value which is held, it is possible to inhibit the flow of the through current in the logic circuit so that power consumption can be suppressed.

The operation of the semiconductor integrated circuit 100 will be described below. When testing the semiconductor integrated circuit 100, it is necessary to output the internal signal from each of the external terminals P1 to P5 in order to monitor the internal operation. Thus, in the case where the internal signal should be monitored on the outside, the output control signal is set to the "H" level. If it is not necessary to output the internal signal from each of the external terminals P1 to P5 as in the case where an ordinary user makes use of the semiconductor integrated circuit 100, the output control signal is set to the "L" level.

In the case where the output control circuit 10 receives the output control signal having the "H" level, it outputs the same value as that of the internal signal from each of the external terminals P1 to P5. In the case where the output control circuit 10 receives the output control signal having the "L" level, it outputs an invariable value (a high impedance or previous value) from each of the external terminals P1 to P5.

The effect obtained by the present invention is as follows.

(1) The invariable value is outputted to the outside while the internal signal is processed only on the inside. Consequently, power consumption can be suppressed.

Such a way of giving the output control signal can offer various forms. First to fourth embodiments of the present invention will be described below.

First Embodiment

Figure 4:
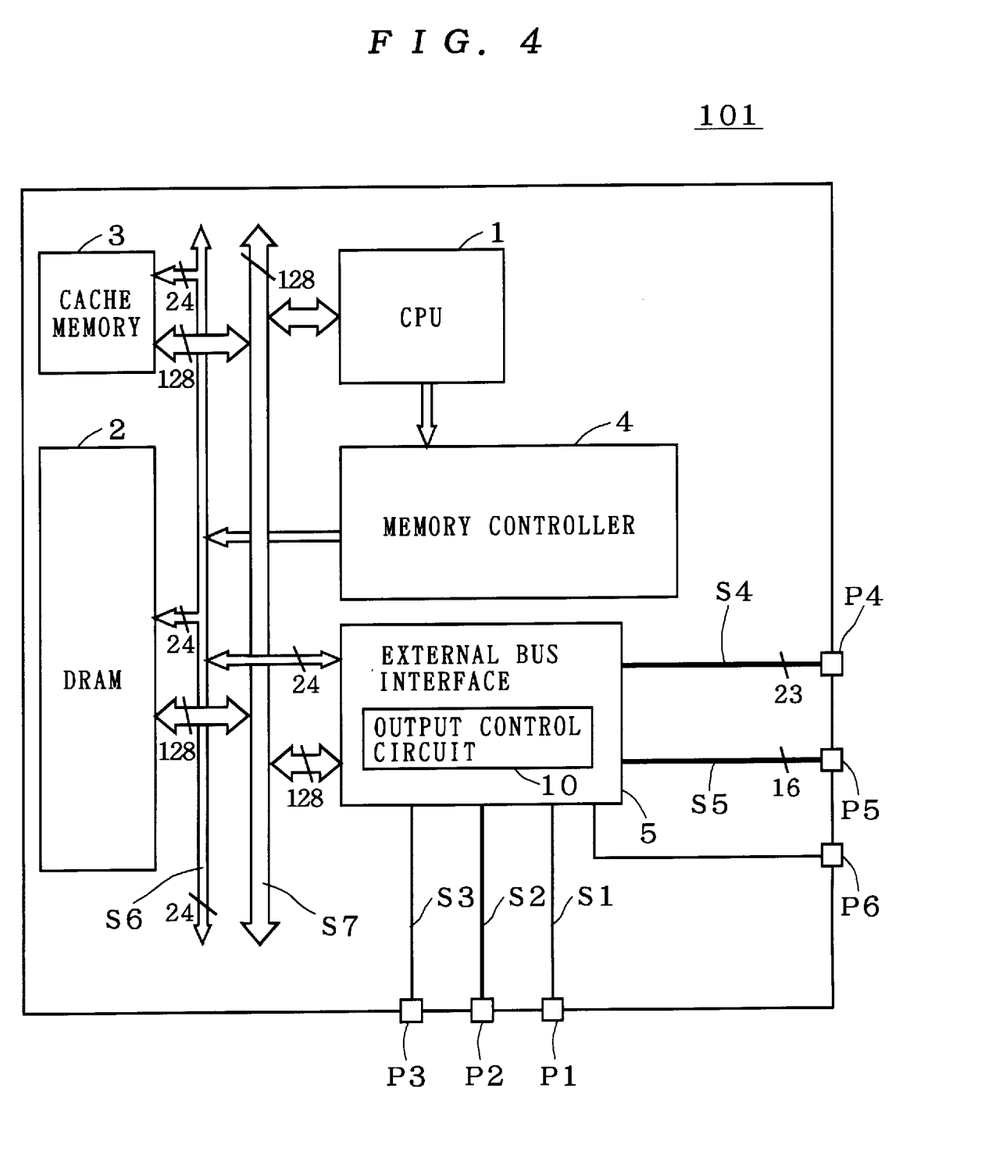
FIG. 4 is a block diagram showing a semiconductor integrated circuit according to a first embodiment of the present invention.

FIG. 4 is a block diagram showing a semiconductor integrated circuit 101 according to a first embodiment of the present invention. In FIG. 4, P6 denotes an external input terminal for inputting an output control signal from outside the circuit, and other designations correspond to the designations in FIG. 1. The circuit shown in FIG. 2 or 3 is used for an output control circuit 10.

The operation of the semiconductor integrated circuit 101 will be described below. It is supposed that the semiconductor integrated circuit 101 is tested. In the case where the internal operation of the semiconductor integrated circuit 101 is monitored during a test, an output control signal having the "H" level is inputted to the external input terminal P6. In the case where an ordinary user makes use of the semiconductor integrated circuit 101, an output control signal having the "L" level is inputted to the external input terminal P6. Other operations are the same as in the description of the principle of the invention.

After the test is terminated and normal operation is confirmed, the description of "the external input terminal P6 is a ground pin" is carried out to provide the semiconductor integrated circuit 101 for the ordinary user.

The effect obtained by the present embodiment is as follows in addition to (1).

(2) The external input terminal P6 is provided so that the outputs of the external terminals P1 to P5 can be controlled from outside the circuit.

Second Embodiment

Figure 5:
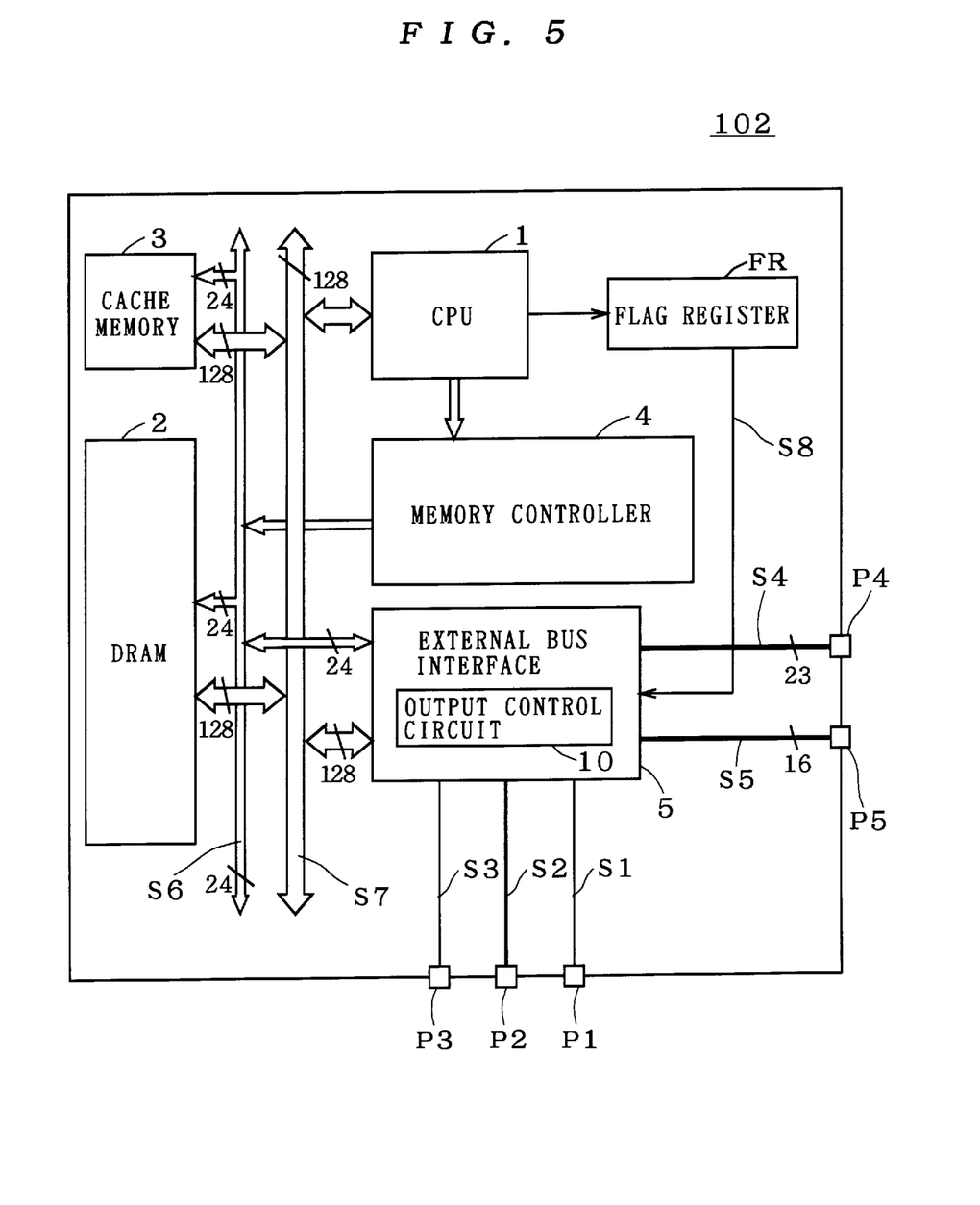
FIG. 5 is a block diagram showing a semiconductor integrated circuit according to a second embodiment of the present invention.

FIG. 5 is a block diagram showing a semiconductor integrated circuit 102 according to a second embodiment of the present invention. In FIG. 5, FR denotes a flag register (an output control signal storing section) for outputting a stored value as an output control signal, S8 denotes a signal line for sending the output control signal from the flag register FR to an output control circuit 10, and other designations correspond to the designations in FIG. 1.

The operation of the semiconductor integrated circuit 102 will be described below. The operation of the semiconductor integrated circuit 102 is broadly divided into a test mode and a normal mode. A microprocessor 1 executes a program written into a DRAM 2. When testing the semiconductor integrated circuit 102, a program including the set instruction of the flag register FR corresponding to the start of internal operation and the end of monitoring is written into the DRAM 2 in advance.

Immediately after the semiconductor integrated circuit 102 is activated, a value written to the flag register FR has the "L" level. In the test mode, the micro-processor 1 first executes the set instruction of the flag register FR and writes a value having the "H" level to the flag register FR. When terminating a test, a value having the "L" level is written to the flag register FR. The flag register FR outputs the written value as the output control signal. Other operations are the same as in the description of the principle of the invention.

The effects obtained by the present embodiment are as follows in addition to (1).

(3) By using the flag register FR, the external input terminal P6 shown in FIG. 4 and the like is not necessary.

(4) The outputs of the external terminals P1 to P5 are controlled by the program so that power consumption can be suppressed.

Third Embodiment

Figure 6:
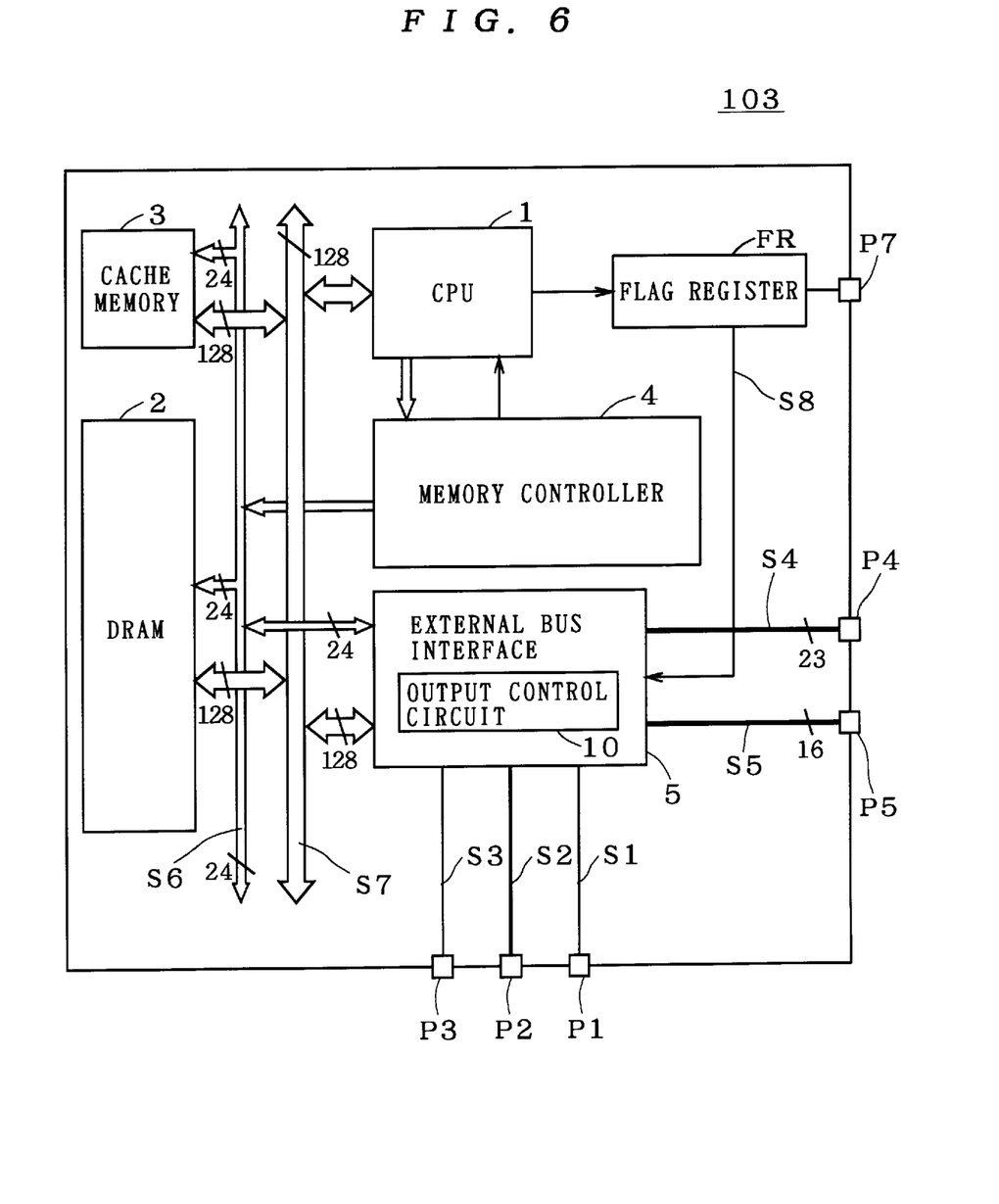
FIG. 6 is a block diagram showing a semiconductor integrated circuit according to a third embodiment of the present invention.

FIG. 6 is a block diagram showing a semiconductor integrated circuit 103 according to a third embodiment of the present invention. In FIG. 6, P7 denotes an external input terminal for inputting, from outside the circuit, an enabling signal which enables to write a value to a flag register FR, and other designations correspond to the designations in FIG. 5.

The operation of the semiconductor integrated circuit 103 will be described below. While the operation of the semiconductor integrated circuit 103 is mainly similar to that of the semiconductor integrated circuit 102, they differ in the operation of the flag register FR. Only in the case where the enabling signal is sent to the external input terminal P7, the microprocessor 1 can write a value to the flag register FR.

An example in which the external input terminal P7 is used will be described below. It is assumed that the above-mentioned enabling signal has the "L" level. First of all, before the semiconductor integrated circuit 103 is provided for an ordinary user, a signal having the "L" level is sent to the external input terminal P7 to perform a test in order to monitor the internal operation of the semiconductor integrated circuit 103. After the test is terminated and normal operation is confirmed, it is sufficient that the description of "the external input terminal P7 is a power pin" is carried out to provide the semiconductor integrated circuit 103. Even if the ordinary user writes a false program, a test mode is not performed.

The effect obtained by the present embodiment is as follows in addition to (1), (3) and (4).

(5) As long as the enabling signal is not given to the external input terminal P7, the effect of (1) is not damaged even if the ordinary user makes use of, in error, a program for enabling a variation in the value of the external terminal.

Fourth Embodiment

Figure 7:
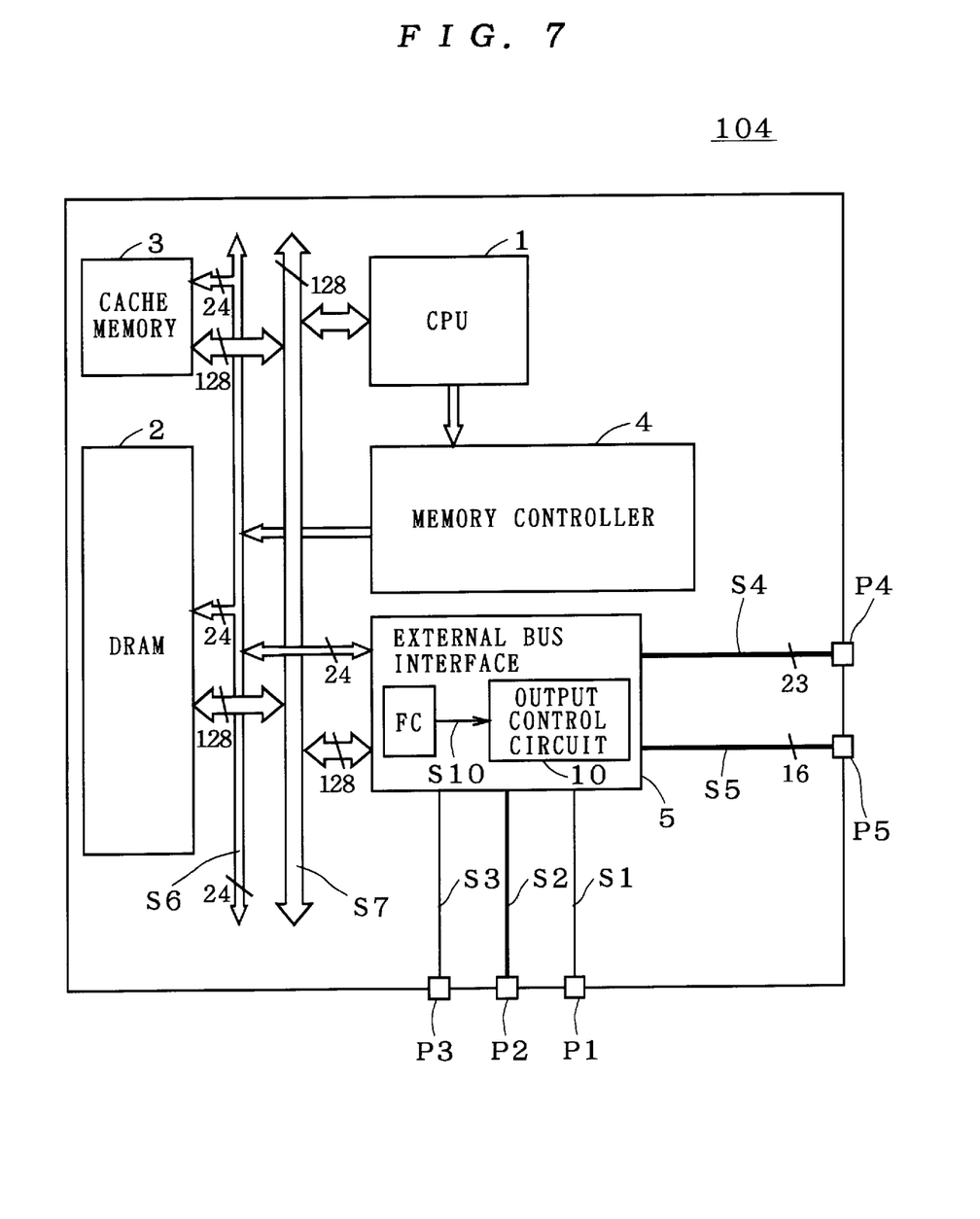
FIG. 7 is a block diagram showing a semiconductor integrated circuit according to a fourth embodiment of the present invention.

FIG. 7 is a block diagram showing a semiconductor integrated circuit 104 according to a fourth embodiment of the present invention. In FIG. 7, FC denotes an output control signal generating circuit (output control signal generating section) including a fuse, S10 denotes a signal line for sending an output control signal from the output control signal generating circuit FC to an output control circuit 10, and other designations correspond to the designations in FIG. 1.

Figure 8:
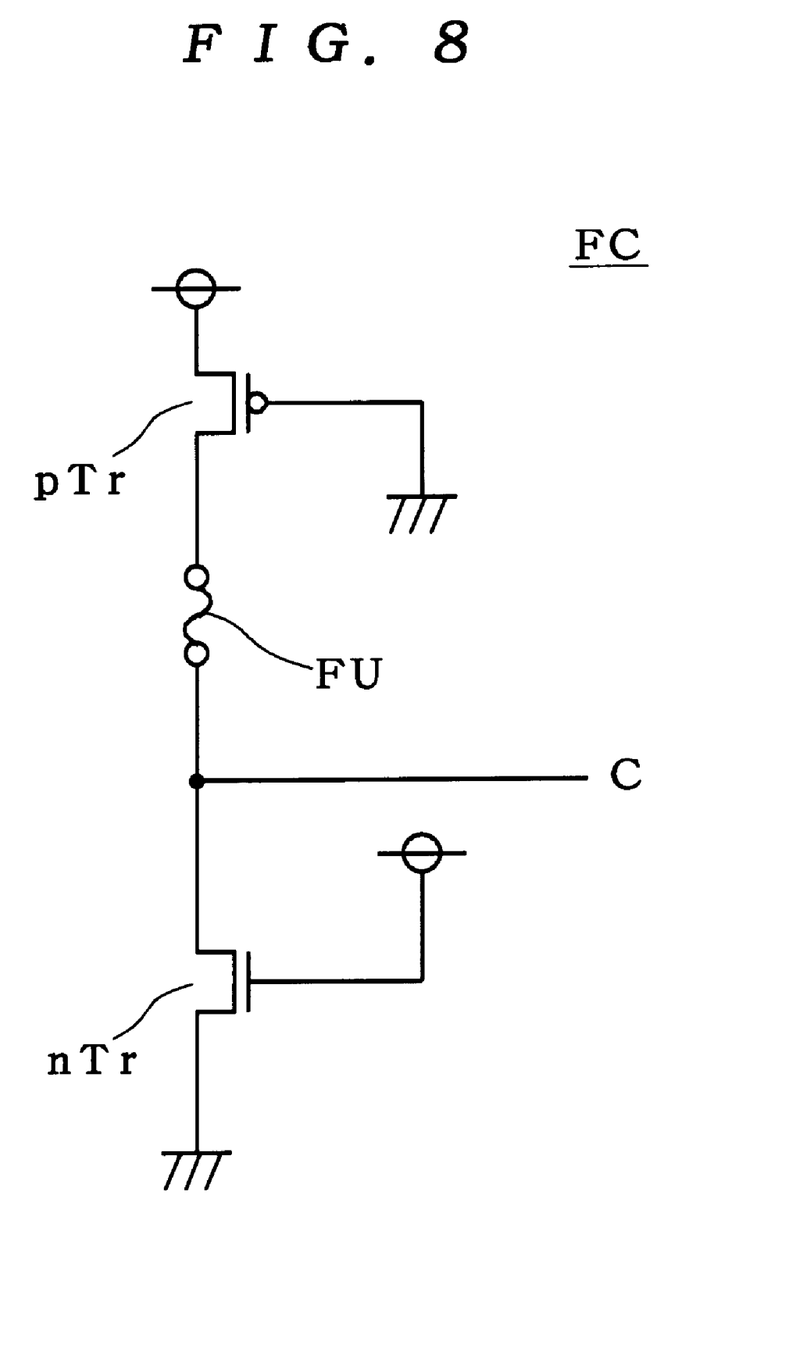
FIG. 8 is a circuit diagram showing an example of an output control signal generating section.

FIG. 8 is a circuit diagram showing an example of the output control signal generating circuit FC. A p-channel transistor pTr, a fuse FU and an n-channel transistor nTr having smaller driving capability than that of the p-channel transistor pTr are connected in series between a power supply and a ground. A gate electrode of the p-channel transistor pTr is connected to a ground. A gate electrode of the n-channel transistor nTr is connected to a power supply.

The operation of the semiconductor integrated circuit 104 will be described below. It is supposed that the semiconductor integrated circuit 104 is tested. In the case where the internal operation of the semiconductor integrated circuit 104 is monitored during a test, the fuse FU shown in FIG. 8 is not disconnected. In the case where an ordinary user makes use of the semiconductor integrated circuit 104, the fuse FU shown in FIG. 8 is disconnected.

In the state where the fuse FU is not disconnected, the output control signal generating circuit FC outputs an output control signal having the "H" level on the power supply side to the output control circuit 10. In the state where the fuse FU is disconnected, the output control signal generating circuit FC outputs an output control signal having the "L" level on the ground side to the output control circuit 10.

An example in which the output control signal generating circuit FC is used will be described below. First of all, the fuse FU is not disconnected in order to monitor the internal operation of the semiconductor integrated circuit 104 in a test performed before the semiconductor integrated circuit 104 is provided for an ordinary user. After the test is terminated and normal operation is confirmed, it is sufficient that the fuse FU is disconnected to provide the semiconductor integrated circuit 104 for the ordinary user. The semiconductor integrated circuit 104 thus provided cannot control the output of the external terminal on the outside.

The effect obtained by the present embodiment is as follows in addition to (1).

(6) The output control signal generating circuit FC is provided so that the output of the external terminal cannot be controlled on the outside after the fuse FU is disconnected. Consequently, it is possible to suppress unnecessary power consumption caused by ordinary user's erroneous use.

While the invention has been described in detail, the foregoing description is in all aspects illustrative and not restrictive. It is understood that numerous other modifications and variations can be devised without departing from the scope of the invention.

We claim:

1. A single chip semiconductor integrated circuit, comprising:

a data processing section for processing data;

a memory for storing said data;

external terminals;

a bus connected to said memory and said data processing section;

an external bus interface for outputting an internal signal at said bus to said external terminals;

an external input terminal for inputting an output control signal which indicates either a first state or a second state from outside said single chip semiconductor integrated circuit, wherein said external bus interface includes an output control section receiving said internal signal and said output control signal for giving, to said external terminals respectively, said internal signal in said first state and a stationary value in said second state;

wherein said output control section is not concerned with said internal signal when said single chip semiconductor integrated circuit gains access to an external memory connected to said external terminals.

2. A single chip semiconductor integrated circuit, comprising:
- a data processing section for processing data;
- a memory for storing said data;
- external terminals;
- a bus connected to said memory and said data processing section;
- an external bus interface for outputting an internal signal at said bus to said external terminals;
- an output control signal storing section for outputting a stored value as an output control signal which indicates either a first or a second state,
  - wherein said external bus interface includes an output control section receiving said internal signal and said output control signal for giving, to said external terminals respectively, said internal signal in said first state and a stationary value in said second state,
  - wherein said output control section is not concerned with said internal signal when said single chip semiconductor integrated circuit gains access to an external memory connected to said external terminals; and
  - wherein a program to be executed by said data processing section to write said value to said output control signal storing section is stored in said memory.

3. The semiconductor integrated circuit as defined in claim 2, further comprising an external input terminal for inputting, from outside said semiconductor integrated circuit, an enabling signal to enable writing of said value to said output control signal storing section,
  - wherein said data processing section can write said value to said output control signal storing section only when said enabling signal is given from said external input terminal.

4. A single chip semiconductor integrated circuit, comprising:
- a data processing section for processing data;
- a memory for storing said data;
- external terminals;
- a bus connected to said memory and said data processing section;
- an external bus interface for outputting an internal signal at said bus to said external terminals;
- an output control signal generating section which includes a fuse and outputs an output control signal which indcates either a first state or a second state indicative of said second or first state corresponding to whether said fuse is disconnected or not,
  - wherein said external bus interface includes an output control section receiving said internal signal and said output control signal for giving, to said external terminals respectively, said internal signal in said first state and a stationary value in said second state,
  - wherein said output control section is not concerned with said internal signal when said single chip semiconductor integrated circuit gains access to an external memory connected to said external terminals.

5. A single chip semiconductor integrated circuit, comprising:
- a data processing section for processing data;
- a memory for storing said data;
- external terminals;
- an output control section for giving, to said external terminals respectively, an internal signal used for processing said data in a first state and a stationary value in a second state; and
- an output control signal generation section which includes a fuse and outputs for outputting to said control section said output control signal indicative of said second or first state corresponding to whether said fuse is disconnected or not,
- wherein said internal signal comprises a signal that controls said memory,
- wherein said output control section receives said internal signal and an output control signal which indicates either a first state or a second state should be given to said external terminals, and
- wherein internal operation of said semiconductor integrated circuit is monitored in said first state and said internal operation of said semiconductor integrated circuit is not monitored in said second state.

* * * * *